United States Patent
Cheng et al.

(10) Patent No.: US 7,450,387 B2
(45) Date of Patent: Nov. 11, 2008

(54) SYSTEM FOR COOLING ELECTRONIC COMPONENTS

(75) Inventors: Sun-Wen Cyrus Cheng, Plano, TX (US); Carl Milton Wildrick, Parker, TX (US)

(73) Assignee: TDK Innoveta Technologies, Inc., Richardson, TX (US)

( * ) Notice: Subject to any disclaimer, the term of this patent is extended or adjusted under 35 U.S.C. 154(b) by 0 days.

(21) Appl. No.: 11/366,877

(22) Filed: Mar. 2, 2006

(65) Prior Publication Data

US 2007/0206361 A1    Sep. 6, 2007

(51) Int. Cl.
*H05K 7/20* (2006.01)
*F28F 7/00* (2006.01)

(52) U.S. Cl. .............. 361/704; 361/707; 361/709; 361/715; 361/719; 165/185; 24/457

(58) Field of Classification Search ............ 361/719, 361/704, 707, 709–710, 714–716; 165/80.3, 165/185; 24/457–458; 248/505, 510
See application file for complete search history.

(56) References Cited

U.S. PATENT DOCUMENTS

| | | | | |
|---|---|---|---|---|
| 3,268,772 A | * | 8/1966 | Kamei et al. ............ | 361/711 |
| 3,579,821 A | * | 5/1971 | Kurisu .................... | 29/841 |
| 4,029,999 A | * | 6/1977 | Neumann et al. ........ | 361/704 |
| 4,481,525 A | * | 11/1984 | Calabro et al. .......... | 257/713 |
| 4,563,725 A | * | 1/1986 | Kirby ...................... | 361/708 |
| 4,635,356 A | * | 1/1987 | Ohuchi et al. ........... | 29/841 |
| 4,768,286 A | * | 9/1988 | Ketcham ................. | 29/841 |
| 4,878,108 A | * | 10/1989 | Phelps et al. ............ | 257/796 |
| 5,054,193 A | * | 10/1991 | Ohms et al. ............. | 29/840 |
| 5,208,733 A | * | 5/1993 | Besanger ................ | 361/704 |
| 5,237,485 A | * | 8/1993 | Cognetti de Martiis et al. ....................... | 361/712 |
| 5,285,350 A | * | 2/1994 | Villaume ................ | 361/690 |
| 5,353,191 A | * | 10/1994 | Volz et al. .............. | 361/690 |
| 5,373,418 A | * | 12/1994 | Hayasi ................... | 361/707 |
| 5,926,369 A | * | 7/1999 | Ingraham et al. ........ | 361/699 |
| 6,034,874 A | * | 3/2000 | Watanabe ............... | 361/704 |

(Continued)

FOREIGN PATENT DOCUMENTS

JP    2004336929 A    * 11/2004

OTHER PUBLICATIONS

Theral Management Products, Chomerics Cat. No. 5509, Oct. 1999, Parker Hannifin Corp., p. 8.*

*Primary Examiner*—Jayprakash N Gandhi
*Assistant Examiner*—Robert J Hoffberg
(74) *Attorney, Agent, or Firm*—David W. Carstens; Carstens & Cahoon, LLP

(57) ABSTRACT

The present invention provides a heat dissipater for use on a circuit board. The invention includes a circuit board having components on at least one side, a rigid plate having thermal conductive properties, and a spring clip that couples said rigid plate to said circuit board and provides a retaining force against the rigid plate. Both the rigid plate and spring clip provide thermal paths to ambient for the circuit board, and in one embodiment, a heat sink or cold plate may be coupled to the rigid plate. Thermal interface material may be filled in between the rigid plate, circuit board and spring clip to provide an efficient thermal path to ambient. The rigid plate, spring clip, and thermal interface material may be electrically insulated.

16 Claims, 3 Drawing Sheets

U.S. PATENT DOCUMENTS

| | | | |
|---|---|---|---|
| 6,035,524 A * | 3/2000 | Suppa et al. | 29/832 |
| 6,093,249 A * | 7/2000 | Curtin | 118/500 |
| 6,130,821 A * | 10/2000 | Gerber | 361/704 |
| 6,205,023 B1 * | 3/2001 | Moribe et al. | 361/704 |
| 6,219,236 B1 * | 4/2001 | Hirano et al. | 361/695 |
| 6,233,150 B1 * | 5/2001 | Lin et al. | 361/704 |
| 6,625,022 B2 * | 9/2003 | Frutschy et al. | 361/700 |
| 6,643,135 B2 | 11/2003 | Tomioka | |
| 6,657,866 B2 * | 12/2003 | Morelock | 361/719 |
| 6,687,126 B2 * | 2/2004 | Patel et al. | 361/702 |
| 6,724,631 B2 | 4/2004 | Ye et al. | |
| 6,992,893 B2 * | 1/2006 | Miyamura et al. | 361/705 |
| 2004/0042179 A1 * | 3/2004 | Murphy | 361/719 |
| 2004/0136161 A1 * | 7/2004 | Miyamura et al. | 361/705 |
| 2007/0133176 A1 * | 6/2007 | Lo | 361/704 |

* cited by examiner

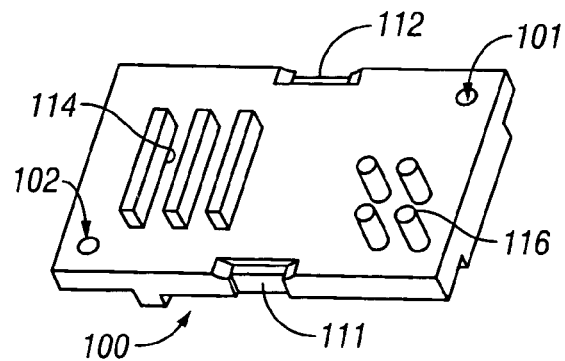
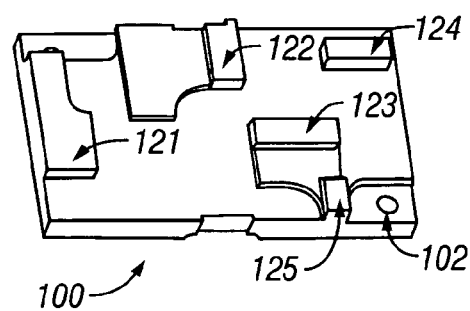
FIG. 1A     FIG. 1B
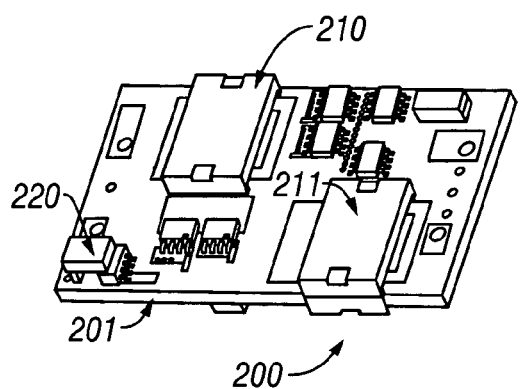
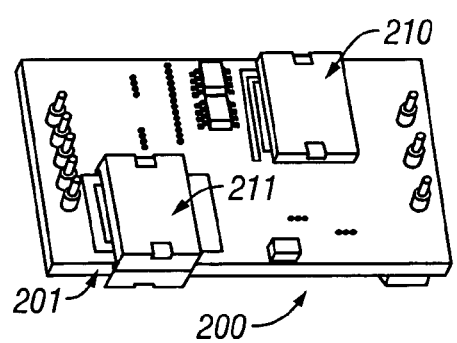
FIG. 2A     FIG. 2B
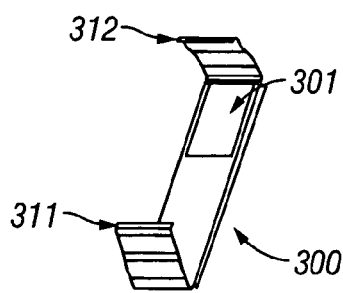
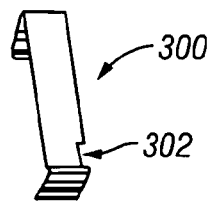
FIG. 3A     FIG. 3B

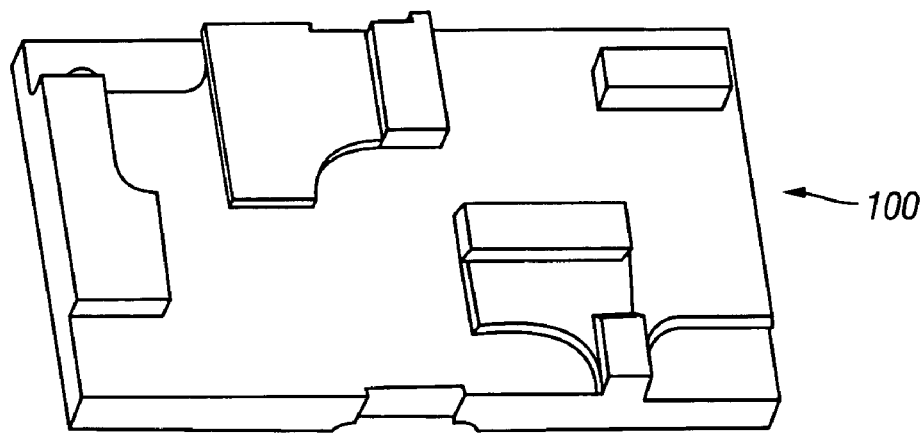
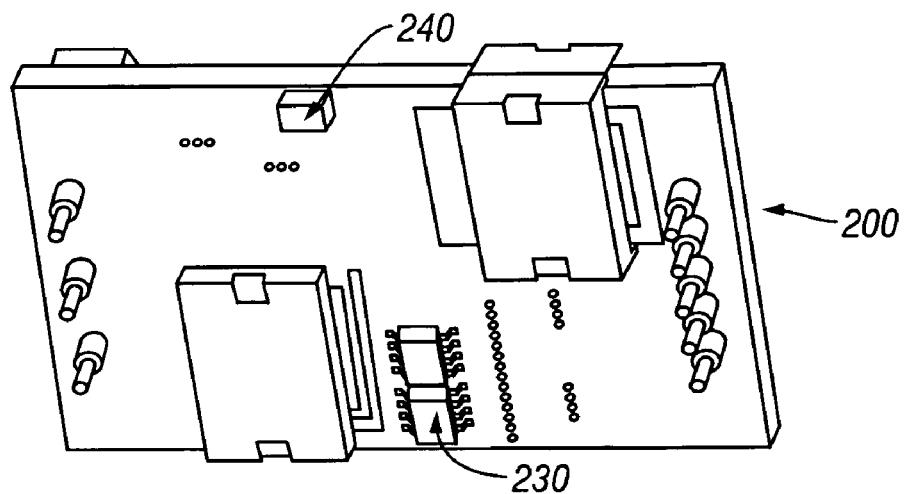
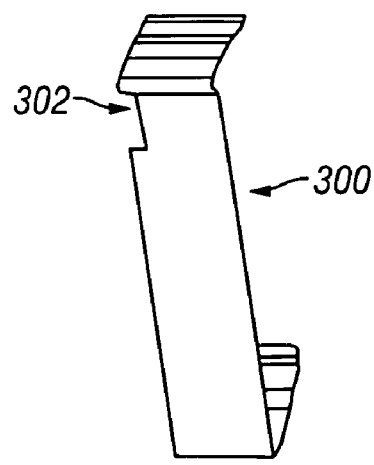
FIG. 4B

SYSTEM FOR COOLING ELECTRONIC COMPONENTS

TECHNICAL FIELD

The present invention relates generally to a cooling mechanism for electronic components. More specifically, the inventions relates to a rigid plate and a spring clip that attach to a power supply to create low-thermal-resistance paths to ambient.

BACKGROUND OF THE INVENTION

To increase useful power from an electronic power source, heat must be dissipated efficiently and effectively from the power supply components. The overall junction-to-ambient thermal resistance ($\theta_{ja}$) decreases after proper improvements are made. Traditionally, to lower this thermal resistance the power components of a board mounted power (BMP) device are soldered onto an insulated metal substrate (IMS) circuit board. End users can then mount a heat sink or cold plate onto the opposite side of the IMS board for better cooling effect.

To reduce assembly time and material cost, manufacturers have produced numerous designs in recent years featuring the structure of a single printed circuit board (PCB) with all components on it. However, PCBs, which typically comprise copper clad, fiberglass and resin, are poor heat dissipaters. Several companies have addressed this problem by applying a rigid plate and thermal interface materials attached to the body of power components. Unfortunately, heat transfer is not significantly improved by this method due to the high thermal resistance of the packaging material of the power components.

Some suppliers offer direct metal contact to cooling media for lowering $\theta_{ja}$. However, each design is unique and costly.

One prior art example uses two mechanical clips to hold two pairs of ferrite cores onto the PCB, and a pair of plastic terminal standoffs to hold tight a combination of a single-board sub-assembly, thermal interface materials, and a base plate. The drain leads/terminals of power Metal-Oxide Semiconductor Field-Effect Transistors (MOSFET) faces the base plate instead of the PCB. The thermal mass of the base plate, as well as its wide contact area, results in a low $\theta_{ja}$. However, the mechanism that holds all parts together is the press fitting between the metal studs on the base plate and the two ribbed holes of each standoff. The fitting pressure reduces because either the plastic standoff is aged, or incorrect assembly process widens one of the ribbed holes, creating reliability issues.

A second prior art example has all electronic components and terminal pins mounted to a single PCB, with an option of adding four metal, thread inserts and a separate base plate. Each insert is installed through a non-plated, pre-drilled hole on the PCB. The threads allow screws from the bottom up to mount this assembly onto a customer's PCB. Alternatively, the threads allow screws from the top down to mount a heat sink onto the base plate. In this design, the vertical position of the base plate is well maintained, and the clearances between the base plate and each power-generating component are minimized. However, the disadvantage of this design is that part of the PCB must be reserved for the pre-drilled holes and inserts, thus reducing the available area for circuit layout. This is especially disadvantageous when the package size shrinks to industry standard $8^{th}$ and even $16^{th}$ bricks.

Another example comprises a single-board power module with flat heat spreaders and thermal interface materials. The thermally conductive, electrically insulated materials are filled among a spreader and power components. These power components may be soldered on the spreader. The thermal materials may also be treated as heat slugs, a kind of underfill. There may also be two or more spreaders on each side of the PCB, and a heat sink can be added right outside either spreader.

Yet another prior art example uses an add-on base plate mounted on top of the bare power module. The base plate is coated with a layer of electrical insulation and has four standoffs in the corners. In each standoff there is a half-way tapped hole matching another tapped hole on the PCB. A thermal interface material is filled between the base plate and power MOSFETs. In this example, the base plate is fastened to the module, and an additional heat sink with a variable fin height can be mounted onto the base plate. The disadvantage of this design is the complicated structure that results in extra labor and material costs, including power coating, different screw sizes, etc.

The final prior art example comprises a spring clip, a heat sink and a base housing with pin sockets. Although the clip provides a retaining force, cooling is not facilitated by the clip. The heat sink serves as the sole source of heat dissipation within the prior art. The clip in the prior art is designed such that air may flow freely through the clip thereby enhancing the ability the heat sink to dissipate heat from the underlying component or components, but the clip itself does not contact the chip heat source directly as a heat dissipating component.

SUMMARY OF THE INVENTION

The present invention provides a heat dissipater for use on a printed circuit board. The invention includes a circuit board having components on at least one side, a rigid plate and a spring clip, both having thermal conductive properties. The spring clip couples the rigid plate to said circuit board and provides a retaining force against the rigid plate. Both the rigid plate and spring clip provide a thermal path to ambient for the circuit board, and in one embodiment, a heat sink or cold plate may be coupled to the rigid plate. Thermal interface material may be filled in between the rigid plate, circuit board and spring clip to provide an efficient path to ambient. The rigid plate, spring clip, and thermal interface material may be electrically insulated. To utilize the present invention, it is not required that any changes be implemented for a circuit layout on a printed circuit board.

BRIEF DESCRIPTION OF THE DRAWINGS

The novel features believed characteristic of the invention are set forth in the appended claims. The invention itself, however, as well as a preferred mode of use, further objects and advantages thereof, will best be understood by reference to the following detailed description of an illustrative embodiment when read in conjunction with the accompanying drawings, wherein:

FIG. 1A shows a top view of a rigid plate in accordance with the present invention;

FIG. 1B shows a bottom view of the rigid plate in accordance with the present invention;

FIG. 2A shows a top view of a power module with which the present invention may be implemented;

FIG. 2B shows a bottom view of the power module with which the present invention may be implemented;

FIG. 3A shows a top view of a spring clip in accordance with the present invention;

FIG. 3B shows a bottom view of the spring clip in accordance with the present invention;

FIG. 4B shows an exploded perspective, bottom view of the assembly of the rigid plate, power module, and spring clip.

DETAILED DESCRIPTION OF THE DRAWINGS

Figure 4A:
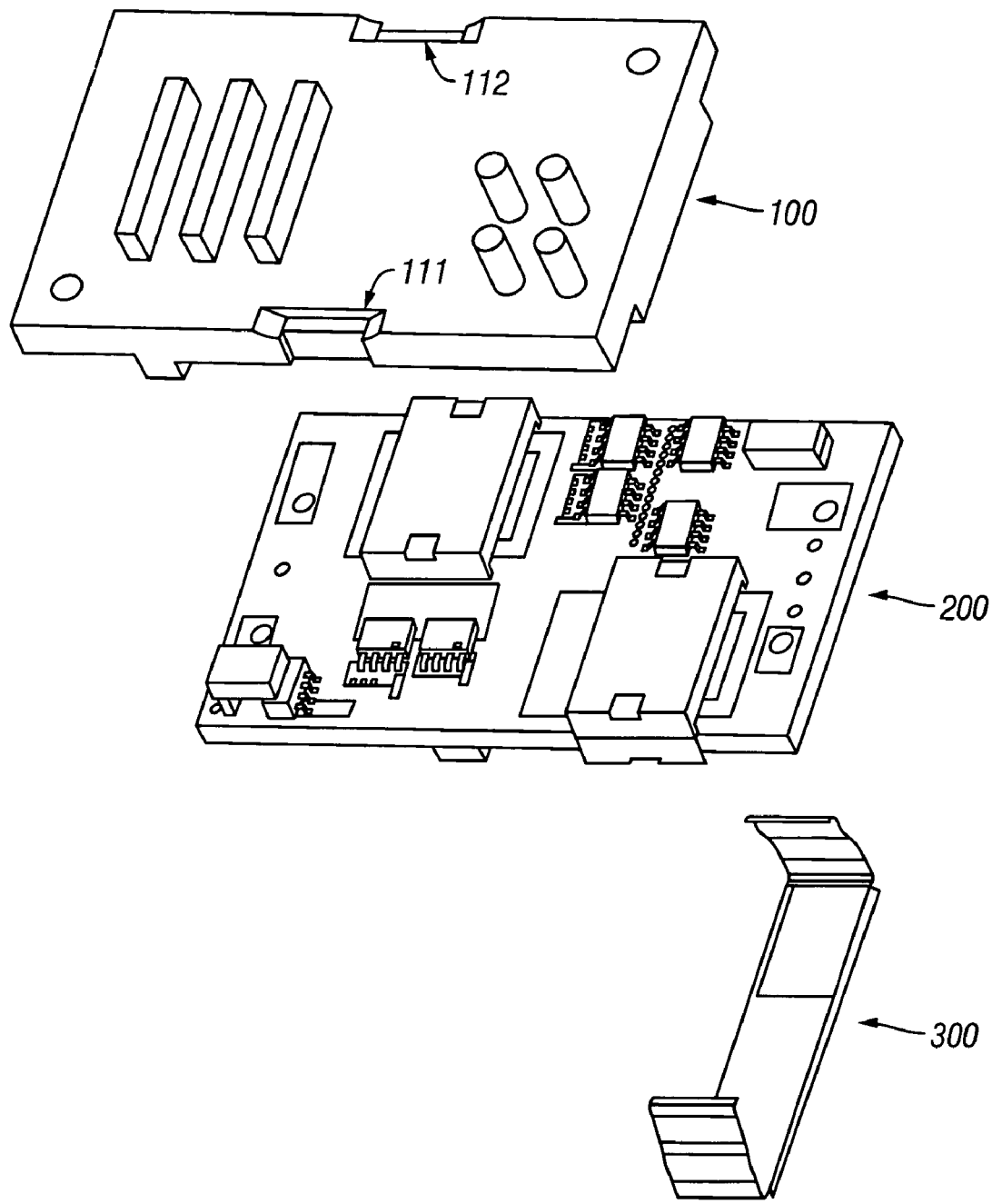
FIG. 4A shows an exploded perspective, top view of the assembly of the rigid plate, power module, and spring clip.

The present invention provides a method for designing power modules with rigid plates and spring clips to improve air cooling and achieve high useful power output. The invention does not require changes in circuit layout and does not require any mechanical fasteners other than the clip between the power supply and the rigid plate. The invention also allows an end user to utilize a heat sink or a cold plate.

FIGS. 1A and 1B show top and bottom views, respectively, of a rigid plate in accordance with the present invention. The rigid plate 100 can be made of metal, plastic, ceramic, composite with high thermally conductive media such as graphite, or a mixture thereof. Preferably, the plate is thermally conductive and may be electrically insulated. The surface of the plate facing the power module, shown in FIG. 1B, may have contours that match the "skyline" of the power module components and create thermal paths to ambient from the power components, such as Field-Effect Transistors (FET), ferrite cores, copper traces on the printed circuit board (PCB), PCB sub-assembly, the base of a terminal pin, etc. The footprint of the rigid plate may be larger or smaller than the footprint of the matched power module The plate surface facing away from the power module, shown in FIG. 1A, may be flat and have mounting holes 101, 102 (either through or blind) for mounting a heat sink or cold plate. In one embodiment, the rigid plate 100 may also also incorporate one or more heat sink feature, like parallel fins 114 or pin fins 116. There may be positions 111, 112 on the rigid plate for spring clips to anchor, but such attachment does not interfere with any heat sink or cold plate due to the recessed anchor points.

As depicted in FIG. 1B, the rigid plate 100 has several pedestals 121, 122, 123, 124, and 125 facing downward that provide flush contact between the rigid plate and the power components, terminal pin bases and copper traces on the module. In some embodiments, thermal interface materials may be utilized to enhance the thermal conductivity from the components on the module to the rigid plate.

FIGS. 2A and 2B show top and bottom views, respectively, of a power module with which the present invention may be implemented. The power module itself 200 is built on a Printed Circuit Board (PCB) 201 that is sufficiently thick to minimize board warping or relaxation during reflow soldering processes. The module can be an existing design, treated as a sub-assembly, with the rigid plate and spring clip added to enhance air cooling without modifying the circuit layout.

The PCB 201 employs one or more magnetic devices 210, 211 such as transformers, that in this case are core-on-board. In the present invention, there is insulation spacing, between the circuits having devices 210 and 211. The rigid plate may attach the large and flat surface of the core-on-board devices without breaking out the isolation requirement. The power module 200 also has a high-profile device 220, such as an inductor, with a surface that is large and flat enough to be attached by the rigid plate 100.

The module 200 may have one or more spots for the clip to anchor. The anchor spots can be a portion of the module's PCB (with or without cutout), a Surface-Mount Technology (SMT) mechanical device, or a mechanical device through a cutout on the PCB. The power module 200 has at least one power component to which the rigid plate 100 directly attaches. There may not necessarily be a power component to which the spring clip directly attaches, but the thermal path created by the clip provides an additional cooling effect (described below).

FIGS. 3A and 3B show top and bottom views, respectively, of a spring clip in accordance with the present invention. Like the rigid plate, the spring clip 300 can be made of metal, plastic, composite with high thermally conductive materials such as graphite, or a mixture thereof. The spring clip is thermally conductive and may be electrically insulated. The electrical insulation may be powder coating or other interface material known in the art. The surface of the clip facing the power module, as shown in FIG. 3A, may have contours 301, 302 to match the "skyline" of the module components. The clip may also have a flat surface that contacts flush with either the power components or the rigid plate. The clip may create thermal paths to ambient from the power components just as the rigid plate does.

The clip 300 may have reinforcement (e.g., folding, bending or stamping) on at least one section to prevent the contact surface(s) facing the power module from bending or twisting, which would decrease the contact area. In the present example, there are two parallel, bent wings along the bottom of the spring clip as shape reinforcement. These wings do not interfere with the PCB and serve as a convection heat transfer agent.

The spring clip may have a non-uniform width 302 and may have one or more anchor tips 311 and 312. The anchor tips may attach to the rigid plate or specific spots on the power module. Additionally, the spring clip does not necessarily have to anchor the rigid plate along a single cross-sectional plane.

FIGS. 4A and 4B show exploded perspective views of the assembly of the rigid plate, power module, and spring clip. FIG. 4A shows the top view perspective, and FIG. 4B shows the bottom view perspective. The spring clip 300 surrounds the bottom side of the power module 200 and a portion of each long side of the module. The clip provides 300 a retaining force to hold the rigid plate 100 tight onto the module's notches on the top side and fits into the notches 111, 112 on each long side of the rigid plate to maintain lateral position. Thermal interface materials may be filled between the rigid plate 100 and the power module 200.

The bottom of the clip 300 contacts flush with at least one power component 230 of the pin side of the module 200, and there is a cutout on the clip that keeps it away from high-profile components 240, as depicted in FIG. 4B. Thermal interface material is between the spring clip 300 and the power components 230. The clip spans wider than the width of the module to avoid interfering with the module's PCB. Due to notches 111, 112, the vertical position of the clip tips does not exceed the top level of the rigid plate, so as not to interfere with the heat sink or cold plate mounting.

The thermal interface materials can be rigid, flexible, phase-changeable, paste-like, or any other type of suitable thermal interface material known in the art. In some embodiments, the material may be filled and minimizes the thermal contact resistance between the power module and the rigid plate, and between the power module and the spring clip if necessary. The thermal interface material may also provide electrical insulation if neither the rigid plate 100 nor spring clip 300 have electrically insulated coatings or properties. The thermal interface material may also provide electrical isolation between the primary and secondary side of the power train. In some embodiments, the thermal interface material can be tacky to allow for better attachment of the rigid plate 100 and spring clip 300 onto the power module 200. The material may be thick enough to eliminate air voids when assembling the rigid plate 100 and spring clip 200. In some embodiments, the thermal interface material may be pre-installed on either the rigid plate 100 or the spring clip 200, or it may be installed when the rigid plate, spring clip and power module are assembled.

The useful power output of the power module 200 is limited by the hottest power components. The paths to ambient provided by the rigid plate and spring clip facilitate an averaging function that reduces the operating temperature of the hottest components. This averaging function allows the power module to operate at a power output level that would normally exceed the operating temperature limit of the hottest component.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated. It will be understood by one of ordinary skill in the art that numerous variations will be possible to the disclosed embodiments without going outside the scope of the invention as disclosed in the claims.

We claim:

1. A heat dissipater for use on a circuit board, comprising:
   (a) the circuit board having power components on at least one side;
   (b) a rigid plate having pedestals on one side facing the circuit board, wherein said pedestals provide flush contact with power components of varying height on the top surface of the circuit board, and wherein the rigid plate has thermally conductive properties; and
   (c) a spring clip having thermally conductive properties that couples said rigid plate to said circuit board, wherein the spring clip spans across the bottom surface of the circuit board and the ends of the clip engage recessed notches on the top of the rigid plate such that the ends of the clip do not exceed the height of the top surface of the rigid plate, wherein the spring clip has at least one notch along its side to accommodate high profile components on the bottom surface of the circuit board.

2. The heat dissipater according to claim 1, wherein the rigid plate provides a thermal path to ambient for the circuit board.

3. The heat dissipater according to claim 1, wherein the spring clip provides a thermal path to ambient for the circuit board.

4. The heat dissipater according to claim 1, further comprising a thermal interface material between the circuit board and the rigid plate.

5. The heat dissipater according to claim 4, wherein the thermal interface material is electrically insulating.

6. The heat dissipater according to claim 1, further comprising a thermal interface material between the rigid plate and spring clip.

7. The heat dissipater according to claim 6, wherein the thermal interface material is electrically insulating.

8. The heat dissipater according to claim 1, wherein the spring clip provides a retaining force against the rigid plate.

9. The heat dissipater according to claim 1, further comprising a heat sink coupled to the rigid plate.

10. The heat dissipater according to claim 1, wherein the rigid plate further comprises mounting holes for mounting a cold plate to the rigid plate.

11. The heat dissipater according to claim 1, wherein the rigid plate is made from one or more of the following materials: metal, plastic, ceramic, and composite.

12. The heat dissipater according to claim 1, wherein the spring clip is made from one or more of the following materials: metal; plastic; and composite.

13. The heat dissipater according to claim 1, wherein the rigid plate has as electrically insulating coating.

14. The heat dissipater according to claim 1, wherein the spring clip is electrically insulated by powder coating.

15. The heat dissipater according to claim 1, wherein the spring clip contacts flush with at least one power component on the bottom of the circuit board.

16. The heat dissipater according to claim 15, wherein the surface of the spring clip facing the circuit board is contoured to accommodate said power component.

* * * * *